United States Patent
Camacho et al.

(10) Patent No.: US 9,076,737 B2
(45) Date of Patent: Jul. 7, 2015

(54) INTEGRATED CIRCUIT PACKAGING SYSTEM WITH BUMPS AND METHOD OF MANUFACTURE THEREOF

(75) Inventors: Zigmund Ramirez Camacho, Singapore (SG); Emmanuel Espiritu, Singapore (SG); Jose Alvin Caparas, Singapore (SG); Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 939 days.

(21) Appl. No.: 12/487,925

(22) Filed: Jun. 19, 2009

(65) Prior Publication Data

US 2010/0320589 A1    Dec. 23, 2010

(51) Int. Cl.
| | |
|---|---|
| *H01L 23/48* | (2006.01) |
| *H01L 23/31* | (2006.01) |
| *H01L 21/56* | (2006.01) |

(52) U.S. Cl.
CPC .......... *H01L 23/3107* (2013.01); *H01L 21/568* (2013.01); *H01L 2224/73265* (2013.01)

(58) Field of Classification Search
USPC .......... 438/112, 124, 126, 127; 257/690–693, 257/738, 787, 784, E23.124, E21.504
See application file for complete search history.

(56) References Cited

U.S. PATENT DOCUMENTS

| | | | | |
|---|---|---|---|---|
| 5,856,212 | A | * | 1/1999 | Chun .............................. 438/126 |
| 6,069,408 | A | * | 5/2000 | Honda et al. ................... 257/787 |
| 6,238,952 | B1 | * | 5/2001 | Lin ................................ 438/110 |
| 6,294,830 | B1 | | 9/2001 | Fjelstad |
| 6,812,125 | B1 | | 11/2004 | Mostafazadeh |
| 6,818,976 | B2 | * | 11/2004 | Kang et al. ..................... 257/684 |
| 6,984,877 | B2 | | 1/2006 | Lee et al. |
| 7,056,766 | B2 | | 6/2006 | Shiu et al. |
| 7,109,065 | B2 | | 9/2006 | Kang et al. |
| 7,160,755 | B2 | | 1/2007 | Lo et al. |
| 7,446,396 | B2 | | 11/2008 | Yim |

OTHER PUBLICATIONS

U.S. Appl. No. 12/185,616, filed Aug. 4, 2008, Camacho et al.

* cited by examiner

*Primary Examiner* — David Vu
(74) *Attorney, Agent, or Firm* — Ishimaru & Associates LLP (57) ABSTRACT

A method of manufacture of an integrated circuit packaging system includes: providing a base strip having a base top side; forming a terminal body with a substantially spherical shape partially in the base strip; attaching a device adjacent the terminal body and over the base top side, a device mount side of the device below a top portion of the terminal body; attaching a device connector to the device and the top portion of the terminal body; applying an encapsulant over the device connector, the device, and the top portion of the terminal body; and removing the base strip providing the terminal body partially exposed from the encapsulant.

10 Claims, 9 Drawing Sheets

INTEGRATED CIRCUIT PACKAGING SYSTEM WITH BUMPS AND METHOD OF MANUFACTURE THEREOF

TECHNICAL FIELD

The present invention relates generally to an integrated circuit packaging system, and more particularly to a system for integrated circuit packages with bumps.

BACKGROUND ART

Chips of the electronic variety are also known as integrated circuit devices. Modern life as we know has been affected in virtually all aspects by tiny chips with integrated circuits. We often take for granted or do not realized that from the smallest cell phone to the heavy equipment for manufacturing aircraft, chips are part of how things get done.

The demands for electronic devices with integrated circuits increasingly require more functions with faster response in reduced dimensions and at lower prices. These high performance devices often demand all of lighter, faster, smaller, multi-functional, highly reliable, and lower cost.

In efforts to meet such requirements, improvements have been attempted in many aspects of electronic product development such as producing smaller and less expensive semiconductor chips. Unfortunately, this development is still not enough to satisfy the demands. Every aspect including packaging can contribute.

Numerous technologies have been developed to meet these requirements. Some research and development focused on new package technologies while others focused on improving existing and mature package technologies. Research and development in package technologies may include a seemingly endless number of different approaches.

One proven way to reduce cost is to use package technologies with existing manufacturing methods and equipments. Paradoxically, the reuse of existing manufacturing processes does not typically result in the reduction of package size. Existing packaging technologies struggle to cost effectively meet demands of today's integrated circuit packages.

Despite the advantages of recent developments in semiconductor fabrication and packaging techniques, there is a continuing need for improving electronic device size, performance, reliability, and manufacturing.

Thus, a need still remains for an integrated circuit packaging system with improved manufacturing processes and materials. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base strip having a base top side; forming a terminal body with a substantially spherical shape partially in the base strip; attaching a device adjacent the terminal body and over the base top side, a device mount side of the device below a top portion of the terminal body; attaching a device connector to the device and the top portion of the terminal body; applying an encapsulant over the device connector, the device, and the top portion of the terminal body; and removing the base strip providing the terminal body partially exposed from the encapsulant.

The present invention provides an integrated circuit packaging system including: a terminal body with a substantially spherical shape; a device adjacent the terminal body, a device mount side of the device below a top portion of the terminal body; a device connector attached to the device and the top portion of the terminal body; and an encapsulant over the device connector, the device, and the top portion of the terminal body, a bottom portion of the terminal body partially exposed from the encapsulant.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with like reference numerals. The embodiments may have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
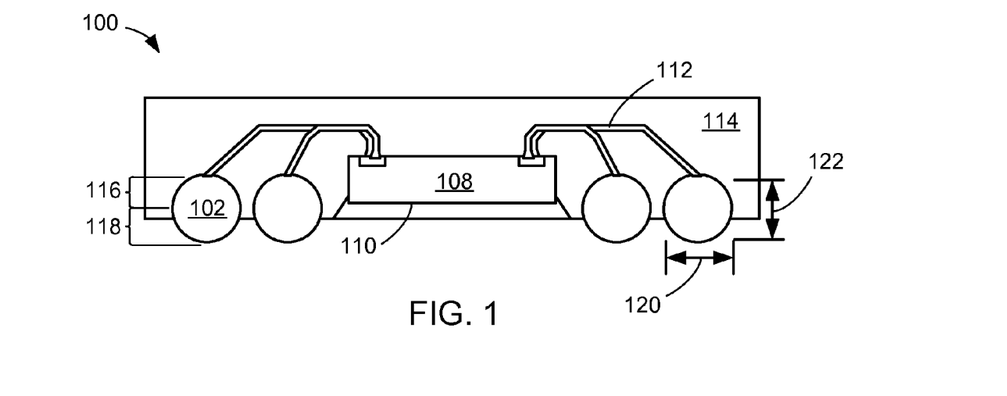
FIG. 1 is a cross-sectional view of an integrated circuit packaging system taken along lines 1-1 of FIG. 2 in a first embodiment of the present invention.
Figure 2:
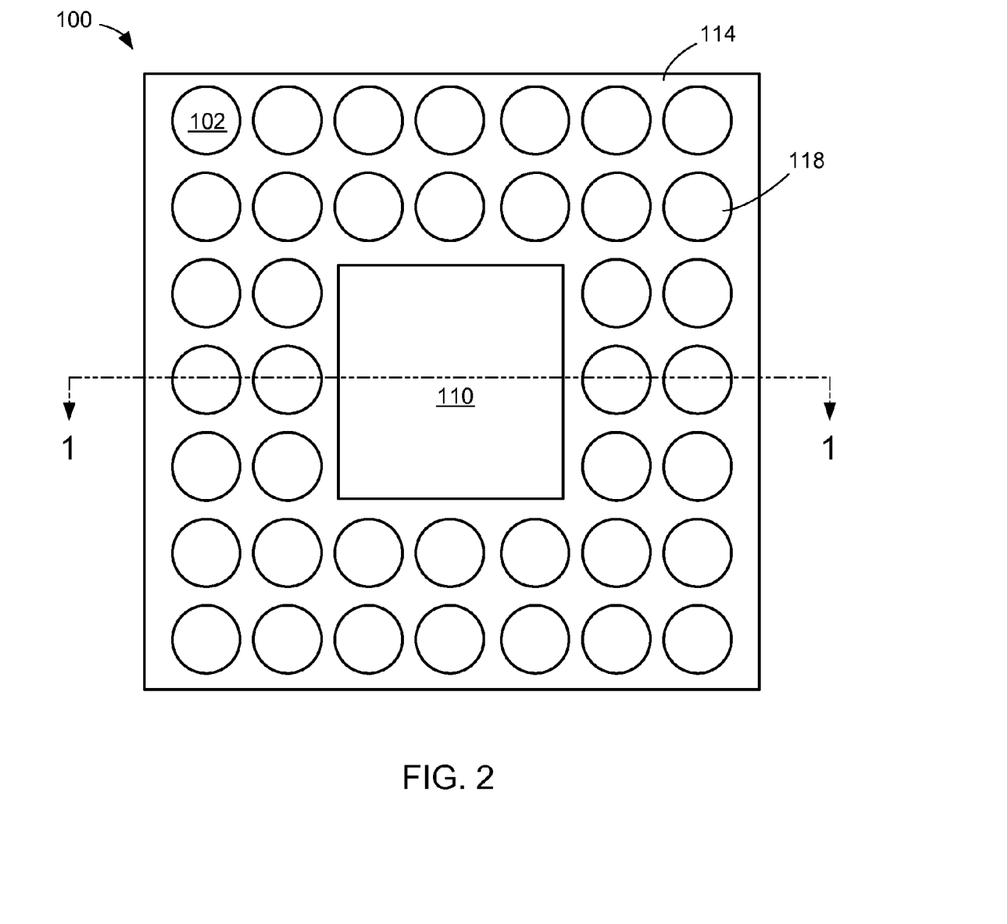
FIG. 2 is a bottom plan view of the integrated circuit packaging system.

Referring now to FIG. 1, therein is shown a cross-sectional view of an integrated circuit packaging system 100 taken along lines 1-1 of FIG. 2 in a first embodiment of the present invention. The integrated circuit packaging system 100 preferably includes terminal bodies 102 having a substantially spherical shape.

The terminal bodies 102 can be formed with materials such as metal, metal coating, conductor, conductive coating, or combination thereof. The terminal bodies can also be formed in a shape of a sphere, prism, or any other shape. For purposes of illustration, the terminal bodies 102 are shown in a shape of a sphere although it is understood that other shapes may be used.

A device 108 such as an integrated circuit die, a flip chip, or other device can be attached or mounted adjacent the terminal bodies 102. The device 108 can preferably be attached with a device mount side 110 and next to the terminal bodies 102 with a spacing predetermined for electrical isolation of the device 108 and the terminal bodies 102. The device mount side 110 can be attached with a conductive or non-conductive material.

Device connectors 112 such as bond wires, planar interconnect, or any other conductive connector can be connected to the device 108 and a portion of the terminal bodies 102 above the device mount side 110. Electrical signals or levels can be conducted to the device 108 or the terminal bodies 102 for electrical intra-connection or inter-connection.

An encapsulant 114 can be formed over the device connectors 112, the device 108, a portion of the terminal bodies 102, or a portion of the device mount side 110. The encapsulant 114 can cover or protect the device connectors 112, the device 108, or a portion of the terminal bodies 102 during processing or in a product.

The terminal bodies 102 preferably include an increased quantity of material predetermined to provide protruded, extended, or raised portions inside and outside an extent of the encapsulant 114. An interconnection portion 116 can provide connection to the device 108 or other components. A bump portion 118 can be substantially exposed from the encapsulant 114 for connection to other components or a next level such as another package or a printed circuit board.

The interconnection portion 116 can extend within the encapsulant 114 by twenty-five percent or more of a terminal body width 120 or a terminal body height 122. For example, a spherical terminal can have the terminal body width 120 substantially the same as the terminal body height 122 whereby the interconnection portion 116 is approximately half of the terminal body height 122 or the terminal body width 120.

It has been unexpectedly found that the present invention with the terminal bodies 102 having the increased quantity of material for the interconnection portion 116 and the bump portion 118 can reduce lengths of the device connectors 112 to reduce electrical parasitics and increase structural integrity to decrease variations from physical specifications. Further, the terminal bodies 102 are compatible with simple and mature manufacturing processes improving manufacturing throughput, yield, and costs.

Thus, it has been discovered that the integrated circuit packaging system of the present invention furnishes important and heretofore unknown and unavailable solutions, capabilities, and functional aspects for improving manufacturing costs, manufacturing throughput, electrical performance, product costs, or structural integrity.

Referring now to FIG. 2, therein is shown a bottom plan view of the integrated circuit packaging system 100. The integrated circuit packaging system 100 preferably an array of the terminal bodies 102. The encapsulant 114 provides the bump portion 118 substantially exposed.

The encapsulant 114 can optionally provide the device mount side 110 substantially exposed. Exposed portions of the device mount side 110 can provide improved attachment or heat dissipation of the integrated circuit packaging system 100.

For purposes of illustration, an array of the terminal bodies 102 in rows and columns is shown although it is understood that any number or configuration of the terminal bodies 102 may be used.

Figure 3:
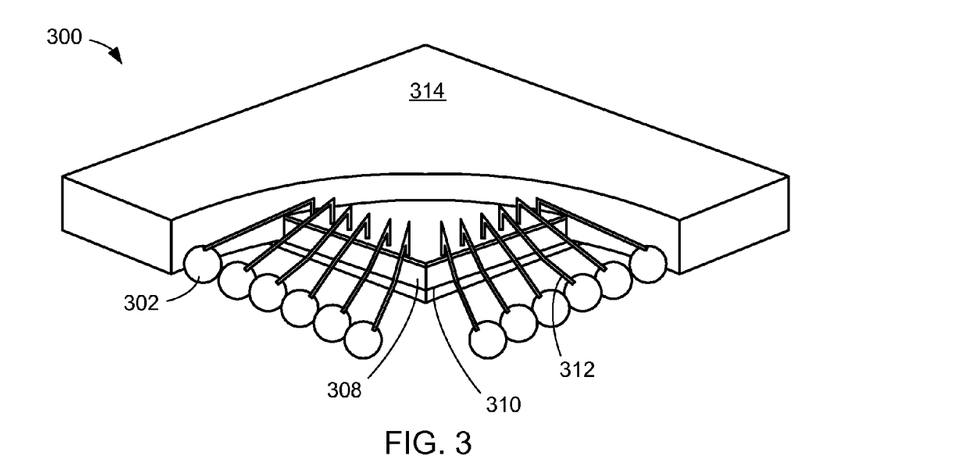
FIG. 3 is an isometric view of an integrated circuit packaging system in a second embodiment of the present invention.

Referring now to FIG. 3, therein is shown an isometric view of an integrated circuit packaging system 300 in a second embodiment of the present invention. A portion of an encapsulant 314 has been removed for clarity. The integrated circuit packaging system 300 preferably includes terminal bodies 302 having a substantially spherical shape.

The terminal bodies 302 can be formed with materials such as metal, metal coating, conductor, conductive coating, or combination thereof. The terminal bodies can also be formed in a shape of a sphere, prism, or any other shape. For example, the terminal bodies 302 can preferably be formed in a shape of a sphere although it is understood that other shapes may be used.

A device 308 such as an integrated circuit die, a flip chip, or other device can be attached or mounted adjacent the terminal bodies 302. The device 308 can preferably be attached with a device mount side 310 next to the terminal bodies 302 with a spacing predetermined for electrical isolation of the device 308 and the terminal bodies 302. The device mount side 310 can be attached with a conductive or non-conductive material.

Device connectors 312 such as bond wires, planar interconnect, or any other conductive connector can be connected to the device 308 or a portion of the terminal bodies 302 above the device mount side 310. Electrical signals or levels can be conducted to the device 308 or the terminal bodies 302 for electrical intra-connection or inter-connection.

The encapsulant 314 can be formed over the device connectors 312, the device 308, a portion of the terminal bodies 302, or a portion of the device mount side 310. The encapsulant can cover or protect the device connectors 312, the device 308, or a portion of the terminal bodies 302 during processing or use in a product.

For purposes of illustration, the terminal bodies 302 are shown in a single row along each edge of the device although it is understood that any number or configuration of the terminal bodies 302 may be used.

Figure 4:
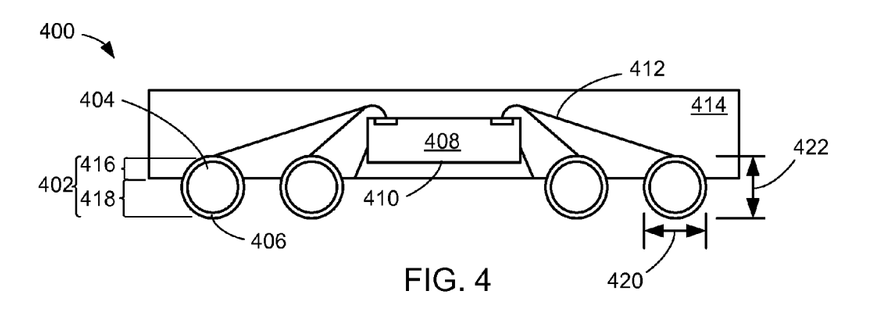
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 preferably includes terminal bodies 402 having a substantially spherical shape and including a terminal core 404 and a terminal layer 406.

The terminal core 404 can be formed of a conductive or non-conductive material including copper or polymer. The terminal layer 406 surrounds and coats the outer surface of the terminal core 404 and can preferably be formed with conductive materials such as a metal coating, a conductive coating, nickel, tin, lead, or any other conductive material. For example, the terminal bodies 402 can preferably be formed in a shape of a sphere although it is understood that other shapes may be used.

A device 408 such as an integrated circuit die, a flip chip, or other device can be attached or mounted adjacent the terminal bodies 402. The device 408 can preferably be attached with a device mount side 410 next to the terminal bodies 402 with a spacing predetermined for electrical isolation of the device 408 and the terminal bodies 402. The device mount side 410 can be attached with a conductive or non-conductive material.

Device connectors 412 such as bond wires, planar interconnect, or any other conductive connector can be connected to the device 408 or a portion of the terminal bodies 402 above the device mount side 410. Electrical signals or levels can be conducted to the device 408 or the terminal bodies 402 for electrical intra-connection or inter-connection.

An encapsulant 414 can be formed over the device connectors 412, the device 408, a portion of the terminal bodies 402, or a portion of the device mount side 410. The encapsulant can cover or protect the device connectors 412, the device 408, or a portion of the terminal bodies 402 during processing or use in a product.

The terminal bodies 402 preferably include an increased quantity of material predetermined to provide protruded, extended, or raised portions with respect to the encapsulant 414. An interconnection portion 416 can provide connection to the device 408 or other components. A bump portion 418 can be substantially exposed from the encapsulant 414 for connection to other components or a next level such as another package or a printed circuit board.

The interconnection portion 416 can extend within the encapsulant 414 by twenty-five percent or more of a terminal body width 420 or a terminal body height 422. For example, a spherical terminal can have the terminal body width 420 substantially the same as the terminal body height 422 whereby the interconnection portion 416 is approximately half or fifty percent of the terminal body height 422 or the terminal body width 420.

For illustrative purposes, an array of the terminal bodies 402 is shown although it is understood that any number, row, column, or configuration of the terminal bodies 402 may be used.

Figure 5:
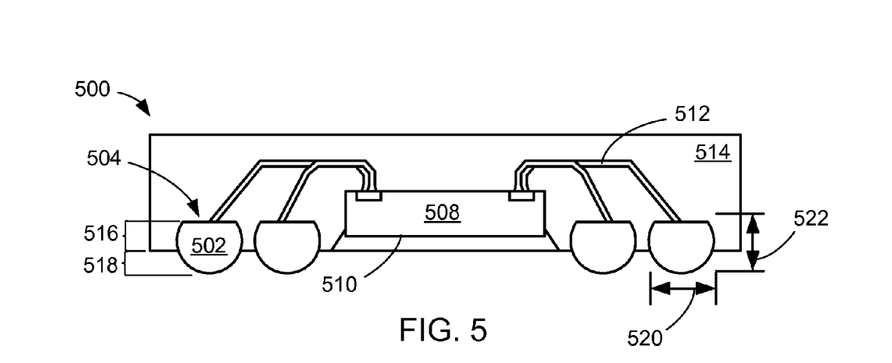
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 preferably includes terminal bodies 502 having a substantially spherical shape.

The terminal bodies 502 can be formed with materials such metal, metal coating, conductor, conductive coating, or combination thereof. The terminal bodies can also be formed in a shape of a sphere, prism, or any other shape. For example, the terminal bodies 502 can preferably be formed in a shape of a partial sphere or truncated sphere with a flat side 504 although it is understood that other shapes may be used.

A device 508 such as an integrated circuit die, a flip chip, or other device can be attached or mounted adjacent the terminal bodies 502. The device 508 can preferably be attached with a device mount side 510 next to the terminal bodies 502 with a spacing predetermined for electrical isolation of the device 508 and the terminal bodies 502. The device mount side 510 can be attached with a conductive or non-conductive material.

Device connectors 512 such as bond wires, planar interconnect, or any other conductive connector can be connected to the device 508 and the flat side 504 of the terminal bodies 502 above the device mount side 510. Electrical signals or levels can be conducted to the device 508 or the terminal bodies 502 for electrical intra-connection or inter-connection.

An encapsulant 514 can be formed over the device connectors 512, the device 508, a portion of the terminal bodies 502, or a portion of the device mount side 510. The encapsulant can cover or protect the device connectors 512, the device 508, or a portion of the terminal bodies 502 during processing or use in a product.

The terminal bodies 502 preferably include an increased quantity of material predetermined to provide protruded, extended, or raised portions with respect to the encapsulant 514. An interconnection portion 516 can include a flattened or truncated surface for connection to the device 508 or other components. A bump portion 518 can be substantially exposed from the encapsulant 514 for connection to other components or a next level such as another package or a printed circuit board.

The interconnection portion 516 can extend within the encapsulant 514 by twenty-five percent or more of a terminal body width 520 or a terminal body height 522. For example, a flattened, truncated, or semi-spherical terminal can have the terminal body height 522 approximately seventy-five percent of the terminal body width 520 substantially whereby the interconnection portion 516 is approximately twenty-five percent of the terminal body height 522 or the terminal body width 520.

Figure 6:
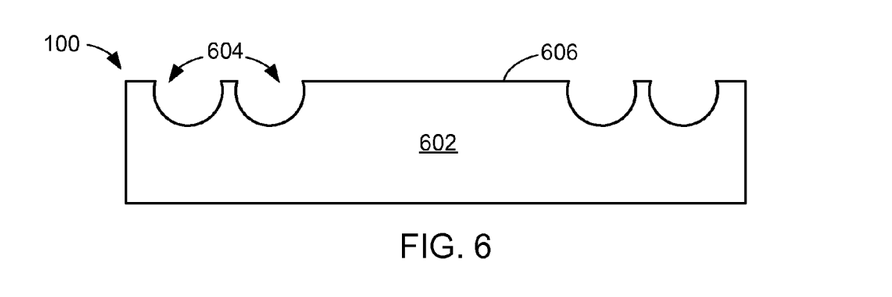
FIG. 6 is a cross-sectional view of the structure of FIG. 1 in a base formation phase.

Referring now to FIG. 6, therein is shown a cross-sectional view of the structure of FIG. 1 in a base formation phase. The integrated circuit packaging system 100 preferably includes a base strip 602 having base cavities 604 such as terminal cavities, ball cavities, or any other conductor support structure in a base top side 606.

The base strip 602 can be formed of a conductive or non-conductive material with the base cavities 604 formed in the base top side 606. For example, the base strip 602 can be formed of an etched copper strip with etched ball cavities in a top side.

Figure 7:
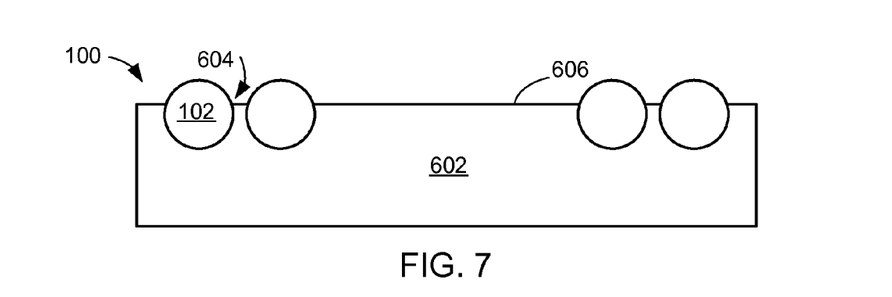
FIG. 7 is a cross-sectional view of the structure of FIG. 6 in a terminal formation phase.

Referring now to FIG. 7, therein is shown a cross-sectional view of the structure of FIG. 6 in a terminal formation phase. The integrated circuit packaging system 100 includes the terminal bodies 102 at least partially in the base cavities 604. The terminal bodies 102 can preferably have a portion above the base top side 606 and a portion below the base top side 606.

For example, the terminal bodies 102 can fill the base cavities 604 and have a portion protruding, extended beyond, or outside the base cavities 604 providing an exposed portion of the terminal bodies 102 above the base top side 606. The exposed portion can provide connectivity to the terminal bodies 102 during processing.

The base strip 602 having the base cavities 604 provides a substantially fixed position and structural integrity for the terminal bodies 102 during processing. The terminal bodies 102 are placed in positions predetermined for electrical isolation from adjacent of the terminal bodies 102 or connectivity to other components or a next level component.

It has been unexpectedly found that the present invention can provide a more prominent and robust lead structure including forming the terminal bodies 102 by simple lead formation processes such as ball drop and eliminating typical processes for Bump Chip Carrier (BCC) manufacture such as resin bump plating processes.

Figure 8:
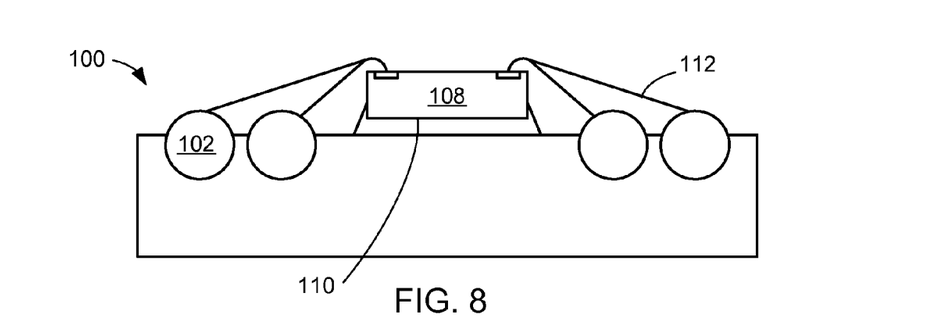
FIG. 8 is a cross-sectional view of the structure of FIG. 7 in a device attachment phase.

Referring now to FIG. 8, therein is shown a cross-sectional view of the structure of FIG. 7 in a device attachment phase. The integrated circuit packaging system 100 includes the device 108 attached or mounted with the device mount side 110 and next to the terminal bodies 102 with a spacing predetermined for electrical isolation of the device 108 and the terminal bodies 102.

The device mount side 110 can attached over or on the base strip 602 wherein the base strip 602 provides a predetermined vertical position or location for the device mount side 110 with respect to the terminal bodies 102. The predetermined vertical position or location can provide improved lengths for the device connectors 112.

The device connectors 112 can electrically connect the device 108 and the terminal bodies 102 providing external connectivity for the device 108. For illustrative purposes, the device connectors 112 are shown as bond wires although it is understood that any connector type or technology may be used.

Figure 9:
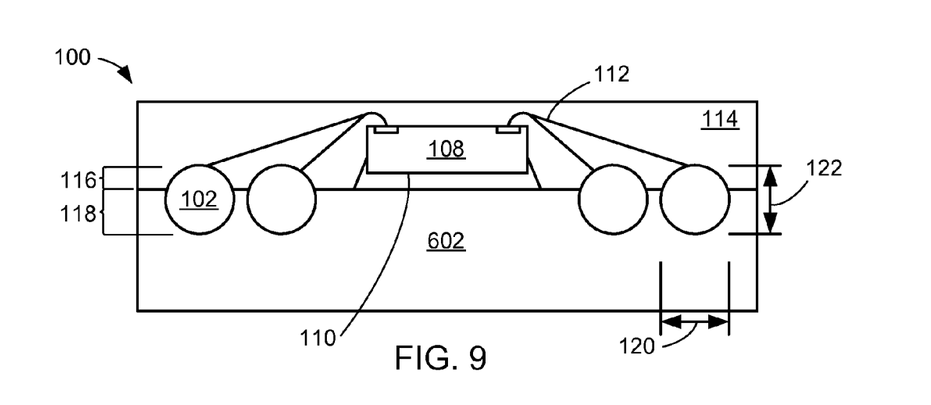
FIG. 9 is a cross-sectional view of the structure of FIG. 8 in an encapsulation phase.

Referring now to FIG. 9, therein is shown a cross-sectional view of the structure of FIG. 8 in an encapsulation phase. The integrated circuit packaging system 100 includes the encapsulant 114 over the device connectors 112, the device 108, a portion of the terminal bodies 102, or a portion of the device mount side 110.

The encapsulant 114 can cover or protect the device connectors 112, the device 108, or a portion of the terminal bodies 102 during processing or use in a product. The encapsulant 114 can cover the interconnection portion 116 of the terminal bodies 102 while the base strip 602 can prevent the encapsulant 114 from covering the bump portion 118 of the terminal bodies 102.

A bottom side of the encapsulant 114 can include characteristics of etching, stripping, or other removal processes applied to the encapsulant 114 such as tooling marks or chemical patterning. Similarly, the bump portion 118 of the terminal bodies 102 can also include characteristics of a removal process applied to the terminal bodies 102 as well as characteristics of fitting to the base strip 602.

Figure 10:
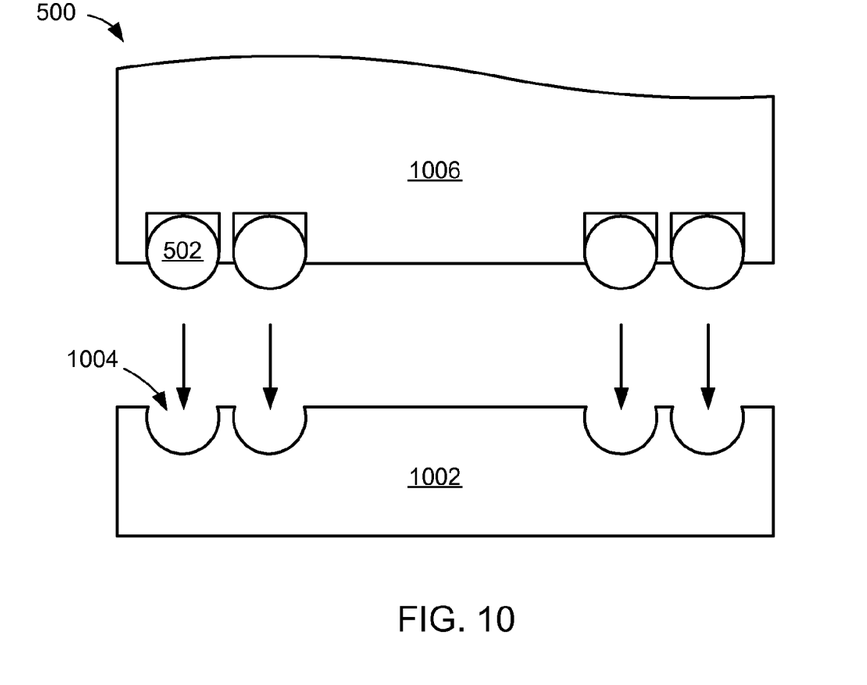
FIG. 10 is a cross-sectional view of the structure of FIG. 5 in a terminal placement phase.

Referring now to FIG. 10, therein is shown a cross-sectional view of the structure of FIG. 5 in a terminal placement phase. The integrated circuit packaging system 500 preferably includes a base strip 1002 having base cavities 1004 such as terminal cavities, ball cavities, or any other conductor support structure.

The base strip 1002 can be formed of a conductive or non-conductive material with the base cavities 1004 formed therein. For example, the base strip 1002 can be formed of an etched copper strip have etched ball cavities.

An attachment tool 1006 such as a ball attach tool, a ball vacuum tool, or any other attach tool can hold the terminal bodies 502 during processing such as alignment, placement, or other manufacturing process.

Figure 11:
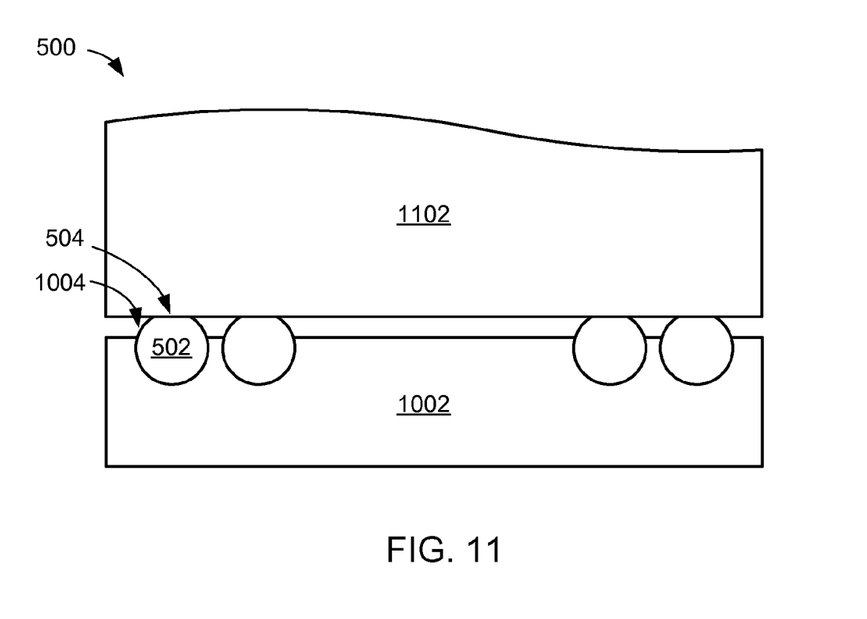
FIG. 11 is a cross-sectional view of the structure of FIG. 10 in a terminal formation phase.

Referring now to FIG. 11, therein is shown a cross-sectional view of the structure of FIG. 10 in a terminal formation phase. The integrated circuit packaging system 500 preferably includes a formation tool 1102 such as ball flattening tool, a ball compression tool, or any other terminal formation tool.

The formation tool 1102 can provide the flat side 504 of the terminal bodies 502. The flat side 504 can be formed after a reflow process. Force fitting the terminal bodies 502 without a reflow process can also provide the flat side 504.

Figure 12:
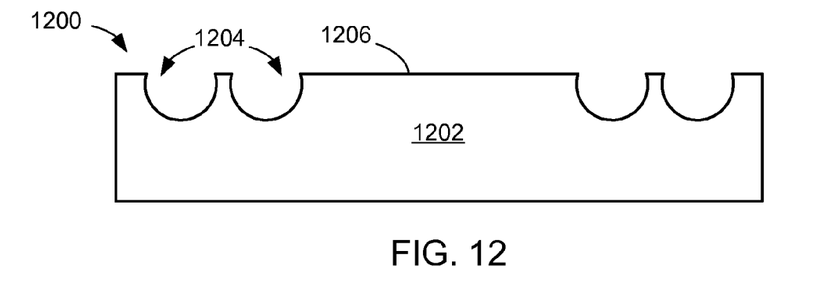
FIG. 12 is a cross-sectional view of an integrated circuit packaging system in a base formation phase of a fifth embodiment of the present invention.

Referring now to FIG. 12, therein is shown a cross-sectional view of an integrated circuit packaging system 1200 in a base formation phase of a fifth embodiment of the present invention. The integrated circuit packaging system 1200 preferably includes a base strip 1202 having base cavities 1204 such as terminal cavities, ball cavities, or any other conductor support structure in a base top side 1206.

The base strip 1202 can be formed of a conductive or non-conductive material with the base cavities 1204 formed in the base top side 1206. For example, the base strip 1202 can be formed of an etched copper strip have etched ball cavities in a top side.

Figure 13:
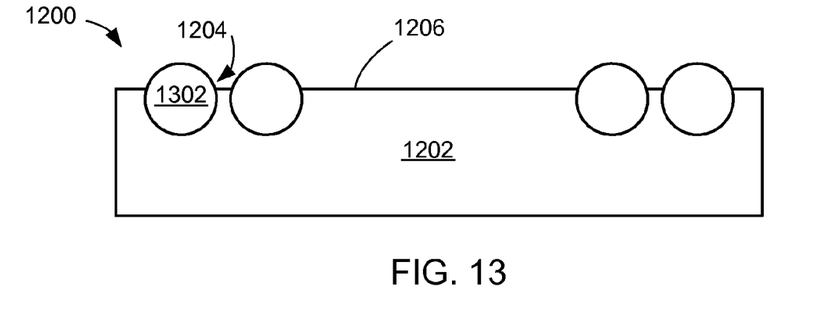
FIG. 13 is a cross-sectional view of the structure of FIG. 12 in a terminal placement phase.

Referring now to FIG. 13, therein is shown a cross-sectional view of the structure of FIG. 12 in a terminal placement phase. The integrated circuit packaging system 1200 preferably includes terminal bodies 1302 having a substantially spherical shape and at least partially in the base cavities 1204. The terminal bodies 1302 can preferably have a portion above the base top side 1206 and a portion below the base top side 1206.

For example, the terminal bodies 1302 can fill the base cavities 1204 and have a portion protruding, extended beyond, or outside of the base cavities 1204 providing an exposed portion of the terminal bodies 1302 above the base top side 1206. The exposed portion can provide connectivity to the terminal bodies 1302 during processing.

The base strip 1202 having the base cavities 1204 provides a substantially fixed position and structural integrity to the terminal bodies 1302 during processing. The terminal bodies 1302 are placed in positions predetermined for electrical isolation from adjacent of the terminal bodies 1302 or connectivity to other components or a next level component.

Figure 14:
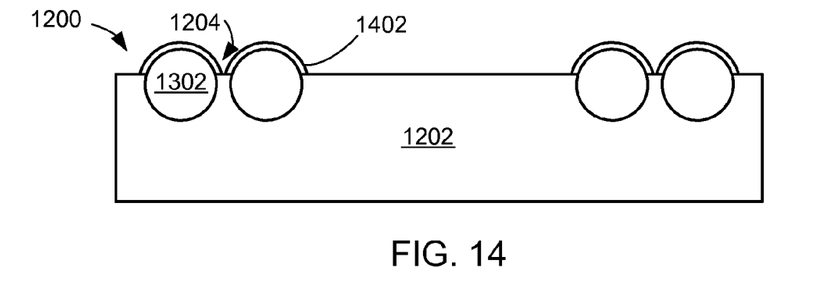
FIG. 14 is a cross-sectional view of the structure of FIG. 13 in a terminal coating phase.

Referring now to FIG. 14, therein is shown a cross-sectional view of the structure of FIG. 13 in a terminal coating phase. The integrated circuit packaging system 1200 preferably includes a coating layer 1402 over the terminal bodies 1302. The coating layer 1402 can be a cap, plating, strip, or any other form of cover.

The coating layer 1402 can also be formed of materials such as nickel, palladium, any conductive material, or combination thereof. Materials such as nickel or palladium can improve wetting or conductor attachment.

Figure 15:
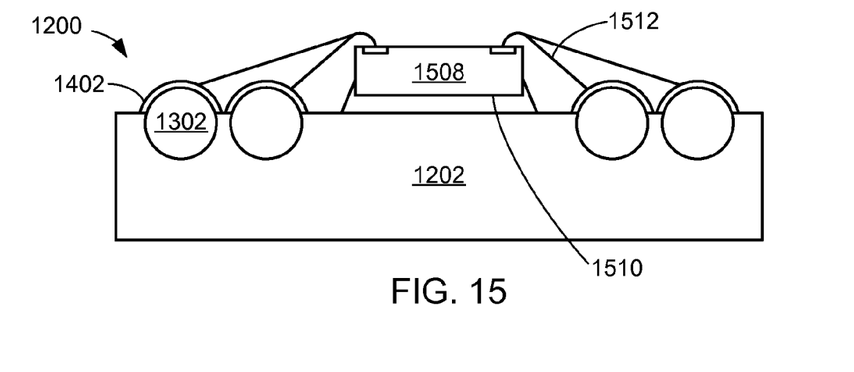
FIG. 15 is a cross-sectional view of the structure of FIG. 14 in a device attachment phase.

Referring now to FIG. 15, therein is shown a cross-sectional view of the structure of FIG. 14 in a device attachment phase. The integrated circuit packaging system 1200 preferably includes a device 1508 attached or mounted with a device mount side 1510 and next to the terminal bodies 1302 with a spacing predetermined for electrical isolation of the device 1508 and the terminal bodies 1302.

The device mount side 1510 can attached over or on the base strip 1202 wherein the base strip 1202 provides a predetermined vertical position or location for the device mount side 1510 with respect to the terminal bodies 1302. The predetermined vertical position or location can provide improved lengths for device connectors 1512.

The device connectors 1512 can electrically connect the device 1508 and the coating layer 1402 and thereby the terminal bodies 1302 providing external connectivity for the device 1508. For illustrative purposes, the device connectors 1512 are shown as bond wires although it is understood that any connector type or technology may be used.

Figure 16:
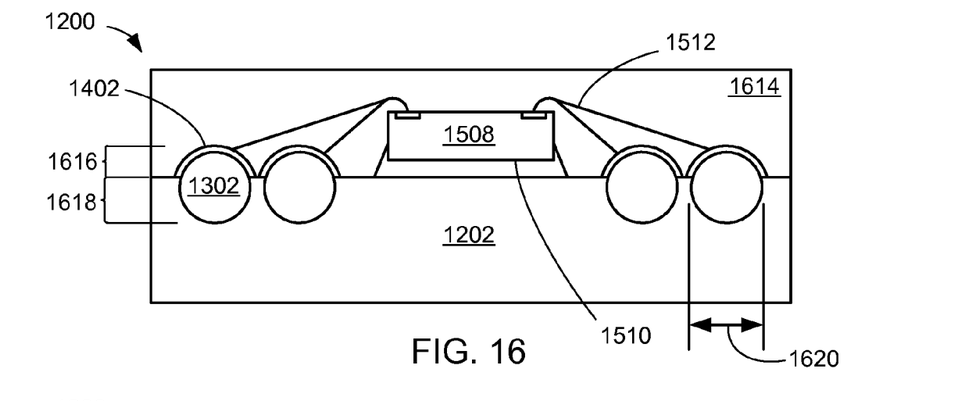
FIG. 16 is a cross-sectional view of the structure of FIG. 15 in an encapsulation phase.

Referring now to FIG. 16, therein is shown a cross-sectional view of the structure of FIG. 15 in an encapsulation phase. The integrated circuit packaging system 1200 preferably includes an encapsulant 1614 over the device connectors 1512, the device 1508, a portion of the terminal bodies 1302, the coating layer 1402, or a portion of the device mount side 1510.

The encapsulant 1614 can cover or protect the device connectors 1512, the device 1508, the coating layer 1402, or a portion of the terminal bodies 1302 during processing or use in a product. The encapsulant 1614 can cover the coating layer 1402 or an interconnection portion 1616 of the terminal bodies 1302 while the base strip 1202 can prevent the encapsulant 1614 from covering a portion of the coating layer 1402 and a bump portion 1618 of the terminal bodies 1302. The coating layer 1402 can be only on the interconnection portion 1616 of the terminal bodies 1302.

Figure 17:
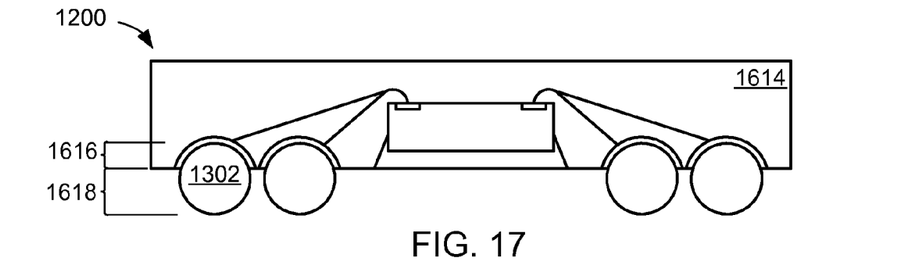
FIG. 17 is a cross-sectional view of the structure of FIG. 16 in a base removal phase.

Referring now to FIG. 17, therein is shown a cross-sectional view of the structure of FIG. 16 in a base removal phase. The integrated circuit packaging system 1200 is shown with the base strip 1202 removed. The base strip 1202 can be removed by etching, stripping, or any other removal process.

The encapsulant 1614 substantially covers the interconnection portion 1616 of the terminal bodies 1302 with the coating layer 1402 as well as providing the bump portion 1618 of the terminal bodies 1302 substantially exposed. The bump portion 1618 can provide connectivity to a next level component such as another package or printed circuit board.

A bottom side of the encapsulant 1614 can include characteristics of etching, stripping, or other removal processes such as tooling marks or chemical patterning. Similarly, the bump portion 1618 of the terminal bodies 1302 can also include characteristics of a removal process as well as characteristics of fitting to the base strip 1202.

Figure 18:
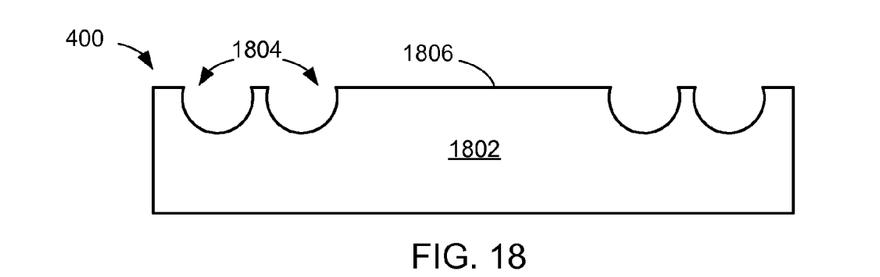
FIG. 18 is a cross-sectional view of the structure of FIG. 4 in a base formation phase.

Referring now to FIG. 18, therein is shown a cross-sectional view of the structure of FIG. 4 in a base formation phase. The integrated circuit packaging system 400 preferably includes a base strip 1802 having base cavities 1804 such as terminal cavities, ball cavities, or any other conductor support structure in a base top side 1806.

The base strip 1802 can be formed of a conductive or non-conductive material with the base cavities 1804 formed in the base top side 1806. For example, the base strip 1802 can be formed of an etched copper strip have etched ball cavities in a top side.

Figure 19:
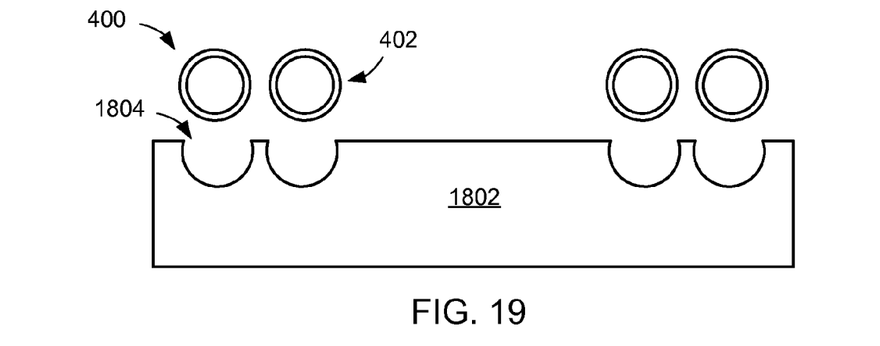
FIG. 19 is a cross-sectional view of the structure of FIG. 18 in a terminal placement phase.

Referring now to FIG. 19, therein is shown a cross-sectional view of the structure of FIG. 18 in a terminal placement phase. The integrated circuit packaging system 400 includes the terminal bodies 402 dropped into the base cavities 1804.

The terminal bodies 402 can be formed of a predetermined shape and size to fit a least partially in the base cavities 1804. A process such as ball drop or ball placement can place the terminal bodies 402 over the base cavities 1804.

Figure 20:
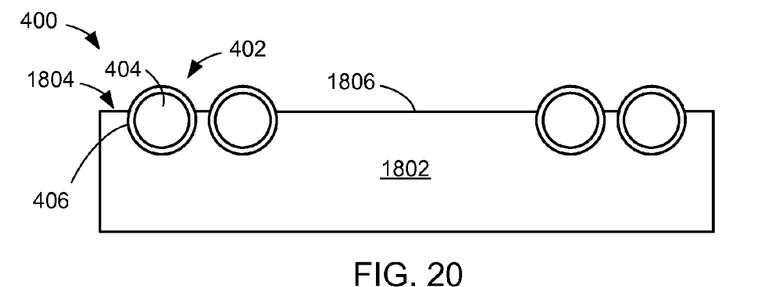
FIG. 20 is a cross-sectional view of the structure of FIG. 19 in a terminal formation phase.

Referring now to FIG. 20, therein is shown a cross-sectional view of the structure of FIG. 19 in a terminal formation phase. The integrated circuit packaging system 400 includes the terminal bodies 402 at least partially in the base cavities 1804. The terminal bodies 402 can preferably have a portion above the base top side 1806 and a portion below the base top side 1806.

For example, the terminal bodies 402 can fill the base cavities 1804 and have a portion protruding, extended beyond, or outside of the base cavities 1804 providing an exposed portion of the terminal layer 406 above the base top side 1806. The exposed portion can provide connectivity to the terminal bodies 402 during processing.

The base strip 1802 having the base cavities 1804 provides a substantially fixed position and structural integrity to the terminal bodies 402 during processing. The terminal bodies 402 are placed in positions predetermined for electrical isolation from adjacent of the terminal bodies 402 or connectivity to other components or a next level component.

A reflow process can be applied to the terminal bodies 402 resulting in conformance to the base cavities 1804. The terminal core 404 or the terminal layer 406 can conform to the base cavities 1804 providing substantially no spacing between the terminal layer 406 and the base cavities 1804.

Figure 21:
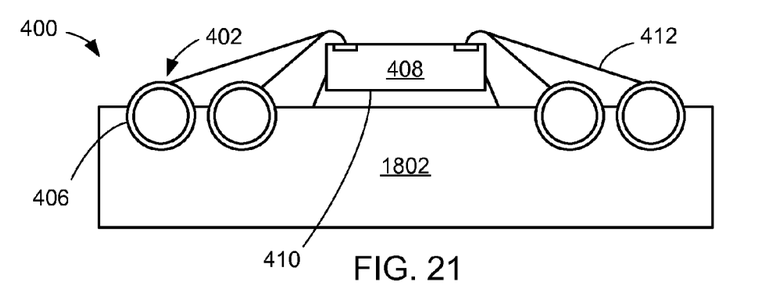
FIG. 21 is a cross-sectional view of the structure of FIG. 20 in a device attachment phase.

Referring now to FIG. 21, therein is shown a cross-sectional view of the structure of FIG. 20 in a device attachment phase. The integrated circuit packaging system 400 preferably includes the device 408 attached or mounted with the device mount side 410 and next to the terminal bodies 402 with a spacing predetermined for electrical isolation of the device 408 and the terminal bodies 402.

The device mount side 410 can attached over or on the base strip 1802 wherein the base strip 1802 provides a predetermined vertical position or location for the device mount side 410 with respect to the terminal bodies 402. The predetermined vertical position or location can provide improved lengths for the device connectors 412.

The device connectors 412 can electrically connect the device 408 and the terminal layer 406 of the terminal bodies 402 providing external connectivity for the device 408. For illustrative purposes, the device connectors 412 are shown as bond wires although it is understood that any connector type or technology may be used.

Figure 22:
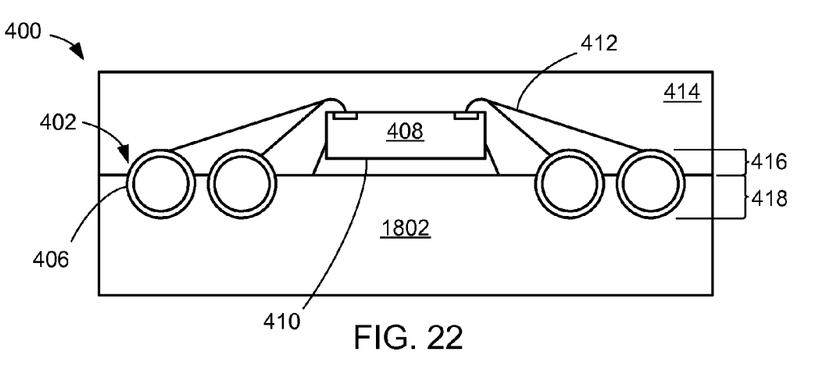
FIG. 22 is a cross-sectional view of the structure of FIG. 21 in an encapsulation phase.

Referring now to FIG. 22, therein is shown a cross-sectional view of the structure of FIG. 21 in an encapsulation phase. The integrated circuit packaging system 400 preferably includes the encapsulant 414 over the device connectors 412, the device 408, a portion of the terminal bodies 402, or a portion of the device mount side 410.

The encapsulant 414 can cover or protect the device connectors 412, the device 408, or a portion of the terminal bodies 402 during processing or use in a product. The encapsulant 414 can cover the interconnection portion 416 of the terminal bodies 402 while the base strip 1802 can prevent the encapsulant 414 from covering the bump portion 418 of the terminal bodies 402.

A bottom side of the encapsulant 414 can include characteristics of etching, stripping, or other removal processes such as tooling marks or chemical patterning. Similarly, the bump portion 418 of the terminal bodies 402 can also include characteristics of a removal process as well as characteristics of fitting to the base strip 1802.

Figure 23:
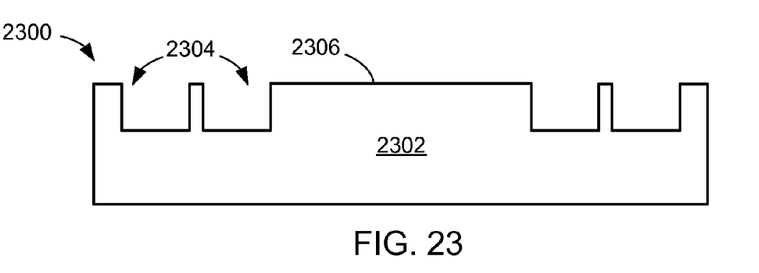
FIG. 23 is a cross-sectional view of an integrated circuit packaging system in a base formation phase of a sixth embodiment of the present invention.

Referring now to FIG. 23, therein is shown a cross-sectional view of an integrated circuit packaging system 2300 in a base formation phase of a sixth embodiment of the present invention. The integrated circuit packaging system 2300 preferably includes a base strip 2302 having base cavities 2304 such as terminal cavities, ball cavities, or any other conductor support structure a base top side 2306.

The base strip 2302 can be formed of a conductive or non-conductive material with the base cavities 2304 formed in the base top side 2306. For example, the base strip 2302 can be formed of an etched copper strip have etched ball cavities in a top side.

Figure 24:
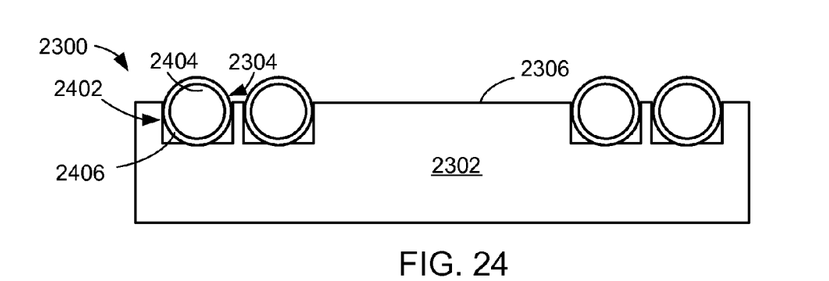
FIG. 24 is a cross-sectional view of the structure of FIG. 23 in a terminal formation phase.

Referring now to FIG. 24, therein is shown a cross-sectional view of the structure of FIG. 23 in a terminal formation phase. The integrated circuit packaging system 2300 includes terminal bodies 2402 having a substantially spherical shape and at least partially in the base cavities 2304. The terminal bodies 2402 can preferably have a portion above the base top side 2306 and a portion below the base top side 2306.

For example, the terminal bodies 2402 can partially fill the base cavities 2304 and have a portion protruding, extended beyond, or outside of the base cavities 2304 providing an exposed portion of the terminal bodies 2402 above the base top side 2306. The exposed portion can provide connectivity to the terminal bodies 2402 during processing.

The terminal bodies 2402 can preferably be placed in the base strip 2302 with an assembly process such as ball drop. The terminal bodies 2402 can be force fit to the base cavities 2304 that can be formed having orthogonal sides such as a rectangular opening. Force fitting the terminal bodies 2402 can result in characteristics of a force fit such as flattened surfaces from substantially flat surfaces of the base cavities 2304 or abrasion markings from contact with sides of the base cavities 2304.

The terminal bodies 2402 can include a terminal core 2404 and a terminal layer 2406. The terminal core 2404 can be formed of a conductive or non-conductive material including copper or polymer. The terminal layer 2406 can be formed with conductive materials such as nickel, tin, lead, or other conductive material. For example, the terminal bodies 2402 can preferably be formed in a shape of a sphere although it is understood that other shapes may be used.

The base strip 2302 having the base cavities 2304 provides a substantially fixed position and structural integrity to the terminal bodies 2402 during processing. The terminal bodies 2402 are placed in positions predetermined for electrical isolation from adjacent of the terminal bodies 2402 or connectivity to other components or a next level component.

Figure 25:
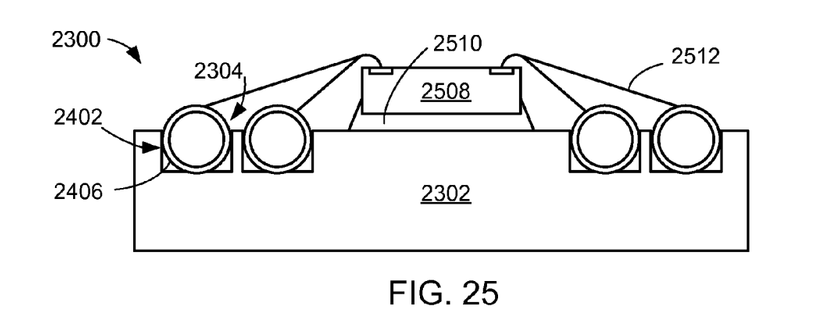
FIG. 25 is a cross-sectional view of the structure of FIG. 24 in a device attachment phase.

Referring now to FIG. 25, therein is shown a cross-sectional view of the structure of FIG. 24 in a device attachment phase. The integrated circuit packaging system 2300 preferably includes a device 2508 attached or mounted with a device mount side 2510 and next to the terminal bodies 2402 with a spacing predetermined for electrical isolation of the device 2508 and the terminal bodies 2402.

The device mount side 2510 can attached over or on the base strip 2302 wherein the base strip 2302 provides a predetermined vertical position or location for the device mount side 2510 with respect to the terminal bodies 2402. The predetermined vertical position or location can provide improved lengths for device connectors 2512.

The device connectors 2512 can electrically connect the device 2508 and the terminal layer 2406 of the terminal bodies 2402 providing external connectivity for the device 2508. For illustrative purposes, the device connectors 2512 are shown as bond wires although it is understood that any connector type or technology may be used.

Figure 26:
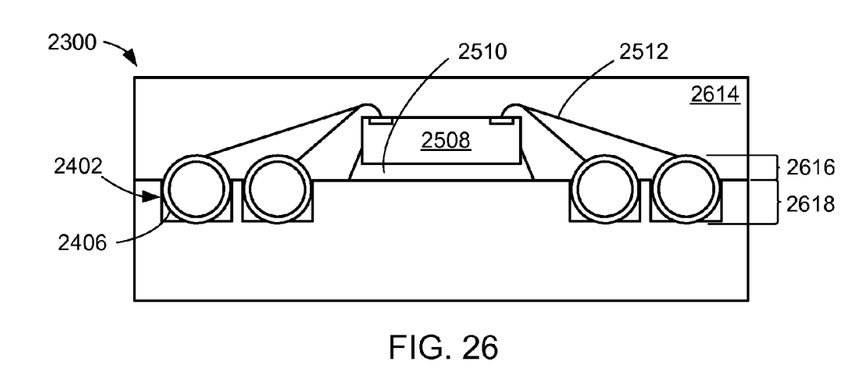
FIG. 26 is a cross-sectional view of the structure of FIG. 25 in an encapsulation phase.

Referring now to FIG. 26, therein is shown a cross-sectional view of the structure of FIG. 25 in an encapsulation phase. The integrated circuit packaging system 2300 preferably includes an encapsulant 2614 over the device connectors 2512, the device 2508, a portion of the terminal bodies 2402, or a portion of the device mount side 2510.

The encapsulant 2614 can cover or protect the device connectors 2512, the device 2508, or a portion of the terminal bodies 2402 during processing or use in a product. The encapsulant 2614 can cover an interconnection portion 2616 of the terminal bodies 2402 while the base strip 2302 can prevent the encapsulant 2614 from covering the bump portion 2618 of the terminal bodies 2402.

Figure 27:
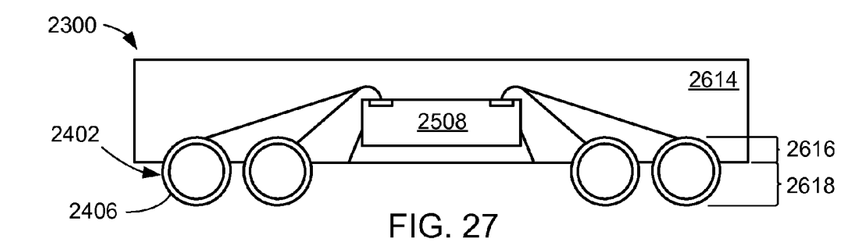
FIG. 27 is a cross-sectional view of the structure of FIG. 26 in a base removal phase.

Referring now to FIG. 27, therein is shown a cross-sectional view of the structure of FIG. 26 in a base removal phase. The integrated circuit packaging system 2300 is shown with the base strip 2302 removed. The base strip 2302 can be removed by etching, stripping, or any other removal process.

The encapsulant 2614 substantially covers the interconnection portion 2616 of the terminal bodies 2402 with the terminal layer 2406 as well as providing the bump portion 2618 of the terminal bodies 2402 substantially exposed. The bump portion 2618 can provide connectivity to a next level component such as another package or printed circuit board.

A bottom side of the encapsulant 2614 can include characteristics of etching, stripping, or other removal processes such as tooling marks or chemical patterning. Similarly, the bump portion 2618 of the terminal bodies 2402 can also include characteristics of a removal process as well as characteristics of fitting to the base strip 2302.

Figure 28:
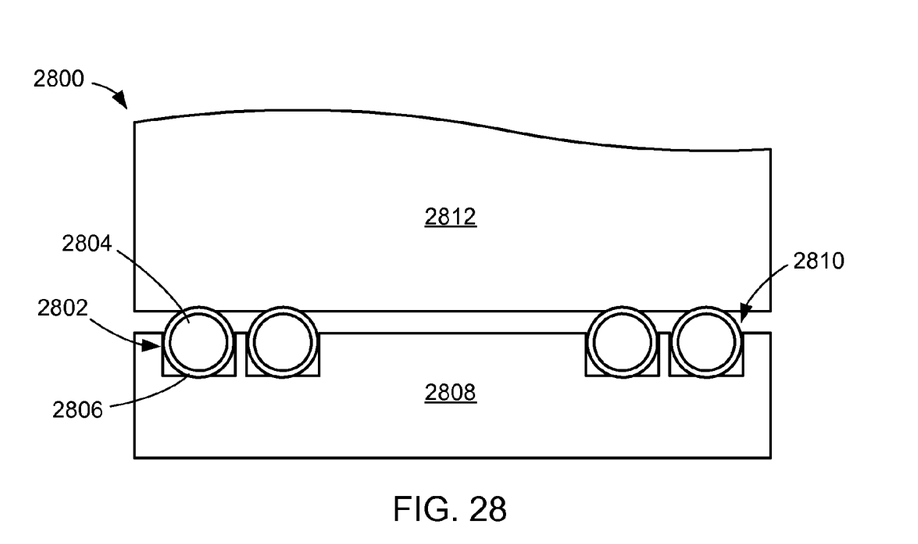
FIG. 28 is a cross-sectional view of an integrated circuit packaging system in a terminal formation phase of a seventh embodiment of the present invention.

Referring now to FIG. 28, therein is shown a cross-sectional view of an integrated circuit packaging system 2800 in a terminal formation phase of a seventh embodiment of the present invention. The integrated circuit packaging system 2800 preferably includes terminal bodies 2802 having a substantially spherical shape and including a terminal core 2804 and a terminal layer 2806.

The terminal bodies 2802 can be placed in a base strip 2808 having base cavities 2810. A formation tool 2812 such as ball press tool, a ball compression tool, or any other terminal formation tool can force fit the terminal bodies 2802 into or at least partially in the base cavities 2810. The formation tool 2812 can also provide flattening of the terminal layer 2806 or the terminal core 2804.

Figure 29:
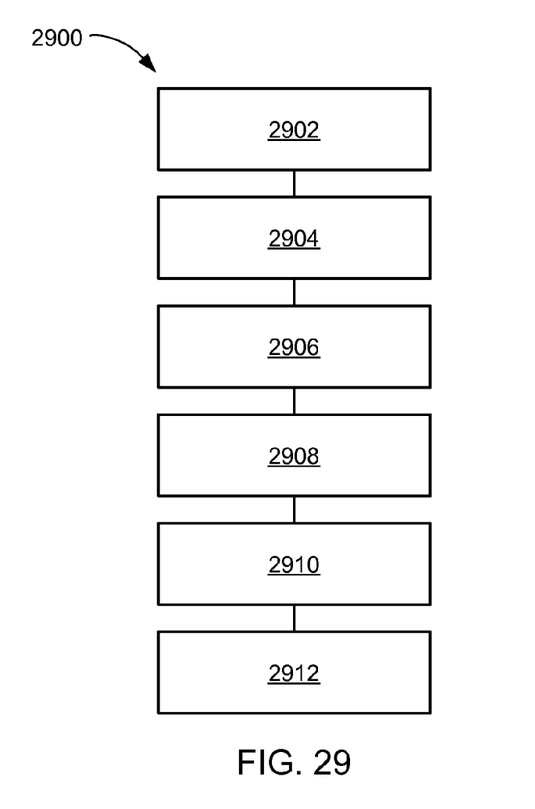
FIG. 29 is flow chart of a method of manufacture of an integrated circuit packaging system in a further embodiment of the present invention.

Referring now to FIG. 29, therein is shown a flow chart of a method 2900 of manufacture of an integrated circuit packaging system in a further embodiment of the present invention. The method 2900 includes providing a base strip having a base top side in a block 2902; forming a terminal body with a substantially spherical shape partially in the base strip in a block 2904; attaching a device adjacent the terminal body and over the base top side, a device mount side of the device below a top portion of the terminal body in a block 2906; attaching a device connector to the device and the top portion of the terminal body in a block 2908; applying an encapsulant over the device connector, the device, and the top portion of the terminal body in a block 2910; and removing the base strip providing the terminal body partially exposed from the encapsulant in a block 2912.

In greater detail, a system to provide the method and apparatus of the integrated circuit packaging system 100, in an embodiment of the present invention, is performed as follows:

1. Providing a base strip having a base cavity in a base top side.

2. Forming a terminal body having a substantially spherical shape with an interconnection portion and a bump portion, the bump portion substantially in the base cavity and the interconnection portion above the base top side.

3. Attaching a device next to the terminal body and over the base top side, a device mount side of the device partially below the interconnection portion.

4. Applying a device connector to the device and the interconnection portion.

5. Applying an encapsulant over the device connector, the device, and the interconnection portion.

6. Removing the base strip having the bump portion substantially exposed from the encapsulant.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a terminal body with a substantially spherical shape, the terminal body having a terminal layer on a terminal core, the terminal core formed from a non-conductive material;
   a device adjacent the terminal body, a device mount side of the device below a top portion of the terminal body;
   a device connector attached to the device and the top portion of the terminal body; and
   an encapsulant over the device connector, the device, and the top portion of the terminal body, a bottom portion of the terminal body partially exposed from the encapsulant.

2. The system as claimed in claim 1 wherein the terminal layer covers the terminal core.

3. The system as claimed in claim 1 wherein the terminal body includes a coating layer over the terminal body.

4. The system as claimed in claim 1 wherein the terminal body includes a flat side of the terminal body.

5. The system as claimed in claim 1 wherein the terminal body includes the terminal body having characteristics of force fitting.

6. The system as claimed in claim 1 wherein:
   the terminal body has an interconnection portion and a bump portion;
   the device is next to the terminal body, the device mount side of the device partially below the interconnection portion;
   the device connector is attached to the device and the interconnection portion; and
   the encapsulant is over the device connector, the device, and the interconnection portion, the bump portion substantially exposed from the encapsulant.

7. The system as claimed in claim 6 wherein:
   the device connector is attached to the terminal layer of the interconnection portion of the terminal body.

8. The system as claimed in claim 6 wherein:
   the terminal body includes a coating layer over the interconnection portion; and
   the device connector is attached to the coating layer.

9. The system as claimed in claim 6 wherein at least twenty-five percent of the terminal body is within the encapsulant.

10. The system as claimed in claim 6 wherein the at least twenty-five percent of the terminal body is substantially exposed from the encapsulant.

\* \* \* \* \*